(12) United States Patent
Kravtchenko et al.

(10) Patent No.: US 6,718,511 B2
(45) Date of Patent: Apr. 6, 2004

(54) METHOD AND APPARATUS TO DETECT A SIGNAL RECEIVED FROM A CHANNEL SIGNAL

(75) Inventors: Alexander Kravtchenko, Villingen-Schwenningen (DE); Marten Kabutz, Villingen-Schwenningen (DE); Bruno Peytavin, Grenoble (FR)

(73) Assignee: Thomson Licensing S.A., Boulogne (FR)

( * ) Notice: Subject to any disclaimer, the term of this patent is extended or adjusted under 35 U.S.C. 154(b) by 366 days.

(21) Appl. No.: 09/739,314

(22) Filed: Dec. 18, 2000

(65) Prior Publication Data

US 2001/0034870 A1 Oct. 25, 2001

(30) Foreign Application Priority Data

Dec. 22, 1999 (EP) .............................................. 99125686
Apr. 27, 2000 (EP) .............................................. 00108898

(51) Int. Cl.[7] ............................................. H03M 13/03
(52) U.S. Cl. ...................... 714/796; 714/794; 714/795; 714/792; 375/262; 375/263; 375/341
(58) Field of Search ........................... 369/32, 59, 170; 375/262, 341, 265, 290–291; 714/796–794, 769, 792, 797

(56) References Cited

U.S. PATENT DOCUMENTS 6,246,723 B1 * 6/2001 Bliss et al. .................. 375/265
6,249,553 B1 * 6/2001 Honma ....................... 375/341

FOREIGN PATENT DOCUMENTS

EP 0606622 A2 7/1994 .......... H03M/13/00

OTHER PUBLICATIONS

M.J. Ferguson: "Optimal Reception for Binary Partial Response Channels", The Bell System Technical Journal, vol. 51, No. 2, Feb. 1972 pp. 493–505.
R.W. Wood et al.: Viterbi Detection of Partial Response on a Magnetic Recording Channel, IEEE Transactions on Communications, vol. com–34, No. 5, May 1986, pp. 454–461.
R.T. Lynch, Jr.: Channels and Codes for Magnetoopical Recording, IEEE Journal on Selected Areas in Communications, vol. 10, No. 1, Jan. 1992, pp. 57–72.
European Search Report citing the above–listed references: AM, AR, AS, and ATand AV.
Modulation and Coding for Information Storage, IEEE No. 12 1991, pp. 68–86.
European Search Report citing the above–listed reference: AR.

* cited by examiner

Primary Examiner—Guy J. Lamarre
(74) Attorney, Agent, or Firm—Joseph S. Tripoli; Paul P. Kiel

(57) ABSTRACT

Disclosed is an apparatus for detecting a signal received from a channel signal and for transforming this signal into a binary code sequence via a signal processing apparatus, which can perform a maximum likelihood detection of the reproduced data from an optical disk with reduced complexity. Accordingly, a method to detect a signal (EBS) received from a channel signal (HF), comprises the steps of digitizing the signal received from the channel, equalizing the digitized signal ($A_k$), generating branch metrics (b_mp, b_pm) from the equalized signal ($B_k$), determining the minimum (b_ml) of the generated branch metrics (b_mp, b_pm), determining a merge (m−, m+, m0) from the minimum (b_ml), and generating a bitstream signal from the succession of merges (m−, m+, m0).

15 Claims, 4 Drawing Sheets

METHOD AND APPARATUS TO DETECT A SIGNAL RECEIVED FROM A CHANNEL SIGNAL

FIELD OF THE INVENTION

The present invention relates to an apparatus for detecting a signal received from a channel signal and for transforming this signal into a binary code sequence. More particularly the invention refers to a signal processing apparatus, which can perform a maximum likelihood detection of the reproduced data from an optical disk.

BACKGROUND OF THE INVENTION

The idealized recording channel has a low pass nature, just as the Duobinary (1+D) partial response (PR1 class) and therefore, for detecting the data read from an optical disk the (1+D) partial response signaling technique can be used.

A method and the respective hardware architecture for implementing a known method requires many computations, particularly for branch metrics calculations and for difference path metric calculations, that requires the additional time and leads to decrease the performance of the detector.

In a known maximum likelihood detector, also referred to herein as ML detector or as MLD apparatus, has been implemented a method, which is also called "Viterbi Detection". This Method is based on the assumption, that the recording channel has a precoder. This method is extremely sensitive to the input signal amplitude variations, because a large number of threshold conditions, for example comparers are used.

SUMMARY OF THE INVENTION

An object of the invention is to develop a maximum likelihood detector with minimal hardware complexity, maximum computational speed, which maximum likelihood detector is not sensitive to variations in the input signal amplitude. In order to reach this goal the following principles are used.

The so-called maximum likelihood detection boils down to finding the admissible sequence $x=x_0, x_1, \ldots, x_n$ that is closest to the detector input sequence $B=B_0, B_1, \ldots, B_n$ in the Euclidean sense. The Euclidean distance $\lambda$ between detector input B and admissible sequence x is $$\lambda = \sum_{k=0}^{n} (B_k - x_k)^2 \tag{1}$$

This is a sum of so-called branch metrics $b_k$ wherein:

$$b_k(B_k - x_k)^2 \tag{2}$$

All metrics $b_k$ may be computed as soon as the $k^{th}$ detector input $B_k$ becomes available. The detector must determine the path through the trellis for which the sum of all branch metrics is smallest. In FIG. 5 there is shown an example of a state transition diagram for two states 0 and 1, which are also indicated as p and m, respectively. The different transitions are indicated by b_pp, b_mp, b_pm, and b_mm, wherein the first index indicates the actual state while the second index indicates the previous state.

For a two state (1+D) maximum likelihood detection the branch metrics are:

1. The data transition path from 1 to 0 in the state transition diagram $$b\_mp = (B_k + Am)^2; \tag{3}$$

2. The data transition path from 0 to 1 in the state transition diagram $$b\_pm = (B_k - Am)^2; \tag{4}$$

3. The data transition path from 0 to 0 in the state transition diagram $$b\_mm = (B_k + 2*Am)^2; \tag{5}$$

4. The data transition path from 1 to 1 in the state transition diagram $$b\_pp = (B_k - 2*Am)^2; \tag{6}$$

wherein the MLD has as input the output of the (1+D) equalizer, $$B_k = A_k + A_{k-1}, \tag{7}$$

where $$A_k = Y_k - Am, \tag{8}$$

and wherein $Y_k$ is a sampled value of an HF signal read from a recording medium after analog-to-digital conversion and Am is a reference value, especially a current value of a so-called slicer.

FIG. 1 shows the signals $Y_k$, $A_k$, $B_k$ respectively. The time axis kT is subdivided in equidistant parts, each vertical line indicating a k-th point in time at which a sample, indicated by a dot, is taken from the continuous signal. The four branch metrics b_mp, b_pm, b_mm, b_pp are calculated at the same time in each decision point (k). One can see that the branch metrics values are the absolute values, which are always positive. This is caused by the square operation. The absolute values undergo the operation $$b\_ml = MIN(b\_mp, b\_pm, b\_pp, b\_mm), \tag{9}$$

where b_ml is the value that corresponds to the at most smallest branch metric. b_ml is thus the branch metric having maximum likelihood of corresponding to the correct transition. Later the value b_ml is used for a merge determination operation.

It is an object of the invention to propose a maximum likelihood detector having reduced complexity.

In order to increase the performance of the maximum likelihood detector, also referred to herein as ML detector or as MLD, without loss of the detecting ability, and in order to reduce the hardware complexity some modifications are implemented into the branch metrics calculation block and the different path metric calculation block is deleted according to the invention.

According to the invention the above-mentioned computations are simplified as follows:

First the square performance operation is rejected. This has the advantage to reduce complexity of the maximum likelihood detector. In the example described above four multiplication operations are avoided.

Second the branch metrics for non-changing state are not determined. This does not influence the maximum likelihood detection in a negative way as nearly no such transitions happen because the HF signal shape is not flat. This property makes possible to reject the branch metric computations (5) and (6).

Further, the branch metrics are calculated by using some properties of the arithmetic system of hardware. This procedure will be described in more detail below.

Minimum branch metrics are determined by computing a sum of absolute values of two branch metrics and using the sign of this sum for determining the minimum branch metrics. This sign is e.g. indicated by the most significant bit in the two's complement binary notation or in any other way, depending on the kind of notation used, known to the skilled person. Advantage of this feature is that summation operation and determination of the sign of a variable are operations which are easy to implement and quickly to perform.

Preferably, the absolute value to be input to the adding operation is generated differently for different branch metrics. For a first branch metric the most significant bit is checked. If it is set to "low" level, the remaining less significant bits, which correspond to the absolute level, are also taken as absolute level for the summation. If the most significant bit is set to "high" level, then the inverted less sigificant bits are taken as absolute value for the summation. For a second branch metric, the selection is done in the opposite way. In this case the absolute value is taken unchanged if the most significant bit is set to "high" level, and its inverted value is taken else. This is true for the two's complement binary notation, however, similar evaluation of the sign, which here corresponds to the most significant bit, and transformation of the absolute value can easily be performed by a skilled person using a different notation than the two's complement notation.

According to the invention, the type of merge is detected from two successive minima of the generated branch metrics. This allows to determine the type of merge even if not all possible types of branch metrics are generated. The types of merges in case of two states are: Change of state from "high" to "low"; change of state from "low" to "high"; and no change of state. In case that branch metrics are generated only for "change of state" then a change of state is determined only if the type of two successive minimum branch metrics changes. No change of state is determined if successive minimum branch metrics are identical.

The device according to the invention comprises the elements as indicated in the independent device claim. An advantage of this device is its relatively easy construction without need of complex or space consuming elements. The equalizer preferably is a (1+D) linear equalizer, combining two successive input values, thus reducing noise in a simple way.

The branch metrics calculator preferably comprises an adder to calculate a branch metric from an equalized signal and an average value or a negated average value. An advantage of using an adder for generating a branch metric is that this is a simple, cost effective element. Although the calculated result might not be as exact as according to known methods, it has proven to be sufficiently exact to receive reliable working results.

The merge determining unit comprises an adder, two multiplexers and two negators for determining a minimum absolute value of two input signals. This has the advantage that a small number of relatively easy elements is sufficient for determining the minimum absolute value of two branch metrics.

Further features and advantages of the invention will become apparent from the description of preferred embodiments using the figures.

DETAILED DESCRIPTION OF PREFERRED EMBODIMENTS

Figure 1:
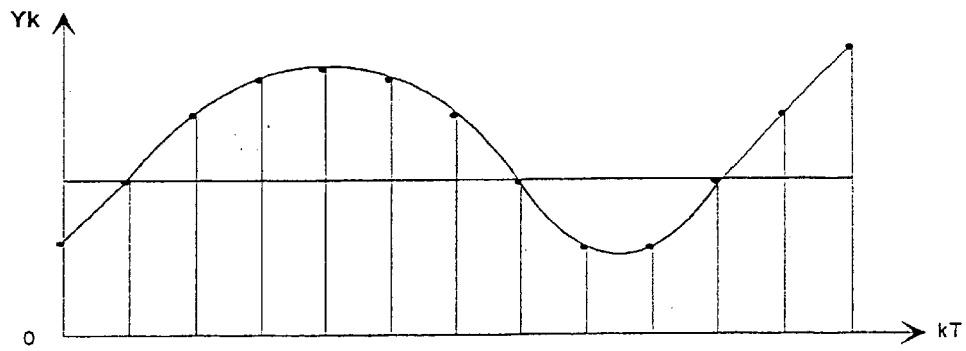
FIGS. 1a)–e) show examplary signals which occur at different steps of the method according to the invention.
Figure 1:
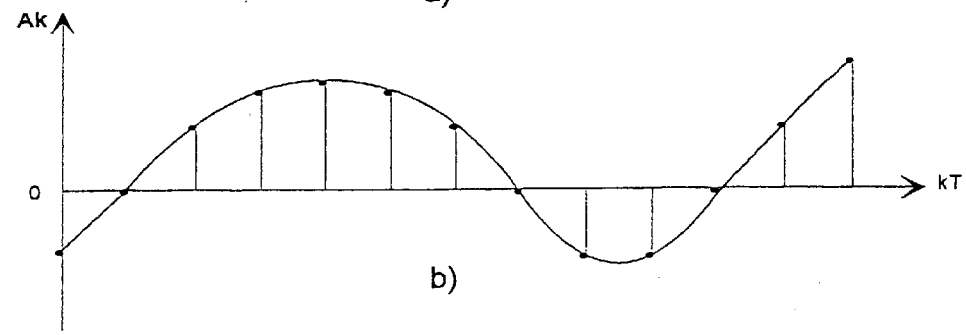
Figure 1:
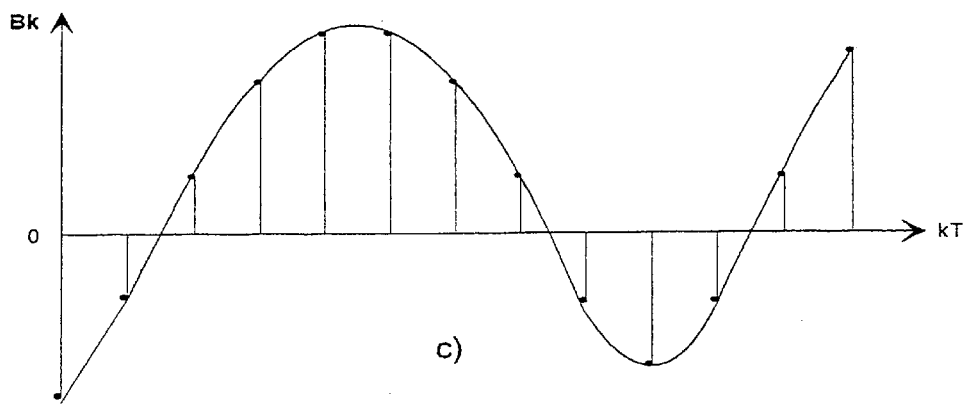
Figure 1:
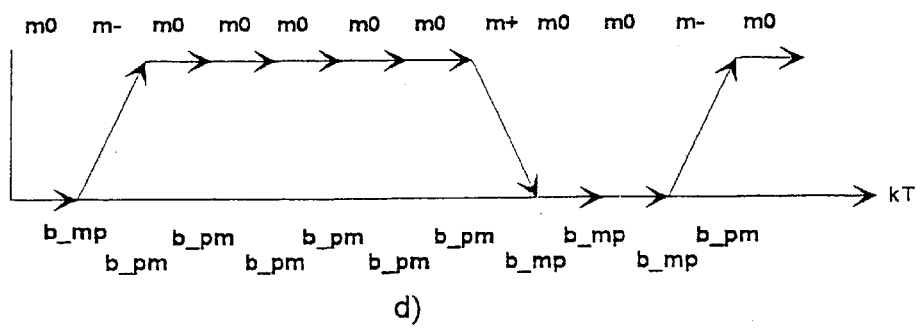

The content of FIGS. 1a)–c) is already described above. According to the invention, only two branch metrics are to calculate: The data transition path from 1 to 0 in the state transition diagram $$b\_mp = B_k + Am; \tag{10}$$

and the data transition path from 0 to 1 in the state transition diagram $$b\_pm = B_k - Am; \tag{11}$$

From these values the smallest branch metric b_ml is to be determined according to:

$$b\_ml = MIN(b\_mp, b\_pm), \tag{12}$$

where b_mp and b_pm are the absolute values.

In each decision point (k) are, at same time, to calculate the values of equations (10) and (11) and then to calculate the value of equation (12). The information from equation (12) is sufficient to determine the merges m−, m+ or m0, wherein m0 indicates a transition with no change of state, m− indicates a transition from "low" to "high" and m+ indicates a transition from "high" to "low". The merges are determined under the following conditions, see also FIG. 1d):

1) if b_ml(k+1)=b_pm and b_ml(k)=b_mp then the merge is of type m−;
2) if b_ml(k+1)=b_pm and b_ml(k)=b_pm then the merge is of type m0;
3) if b_ml(k+1)=b_mp and b_ml(k)=b_pm then the merge is of type m+;
4) if b_ml(k+1)=b_mp and b_ml(k)=b_mp then the merge is of type m0;

The sequence of merges is detected and transformed into a sequence of bits. FIG. 1e) shows the estimated bits sequence output from the path metrics memory.

Figure 2:
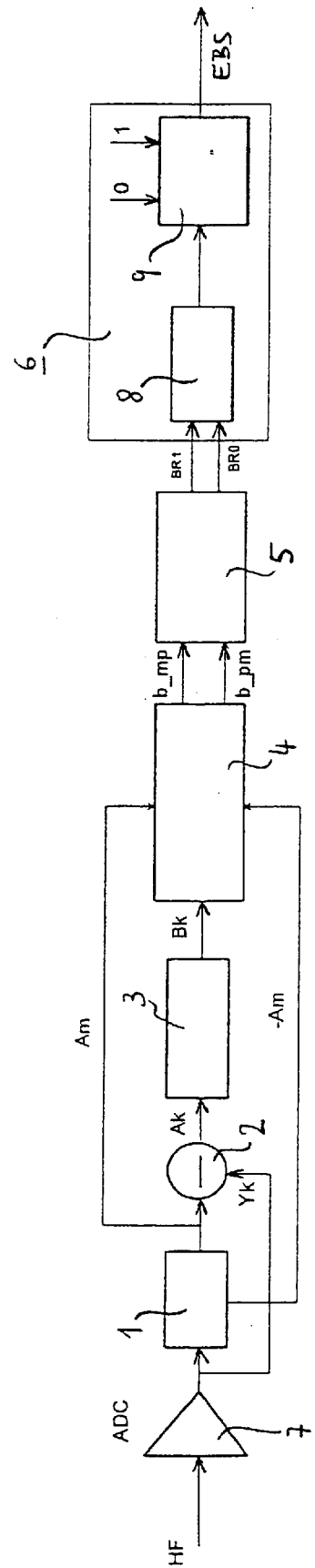
FIG. 2 shows a maximum likelihood detector according to the invention.

The drawing in FIG. 2 illustrates a maximum likelihood detector apparatus according to the invention. The ML Detector consists of six main blocks, a slicer 1, a subtractor 2, a (1+D) Linear equalizer 3, a branch metrics calculation unit 4, a merge determining unit 5 and a merge detecting unit 6.

For the description of an embodiment of the invention it is assumed that the two's complement fixed point arithmetic is used in the ML detector apparatus. Other notations would make necessary slight modifications lying within the knowledge of the skilled person.

A high-frequency data signal HF is read from an optical recording medium in a known way. The high-frequent data signal HF is fed to an analog-to-digital converter 7. The analog-to-digital converter 7 samples its input signal at a given rate and outputs a sampled data signal Y. Each sample of data signal Y is provided with an index k, indicating that it is the k-th sample taken. All other values used in this description and being provided with an index k refer to the k-th sample. Each sampled data signal $Y_k$ is fed to slicer 1 as well as to subtractor 2.

The slicer 1 calculates the average value Am of the sampled data signal $Y_k$. At the same time the slicer 1 calculates the negated value −Am. The average value Am is fed to the subtractor 2. Both, the average value Am and the negated average value −Am are fed to the branch metrics calculation unit 4. The subtractor 2 calculates the value $A_k$, with $A_k=Y_k-Am$.

The linear equalizer 3 generates the detector input values $B_k$ from two successive values $A_k$, $A_{(k-1)}$. The branch metrics calculation unit 4 calculates from detector input value $B_k$ the branch metrics b__mp and b__pm, using average value Am and negated average value −Am.

The merge determining unit 5 generates, from the branch metrics b__mp, b__pm, merge determination signals BR0, BR1, which are fed to a merge detection unit 6. Merge detection unit 6 comprises a control block 8 and a path metrics memory 9, its output signal is an estimated bit sequence EBS.

Figure 3:
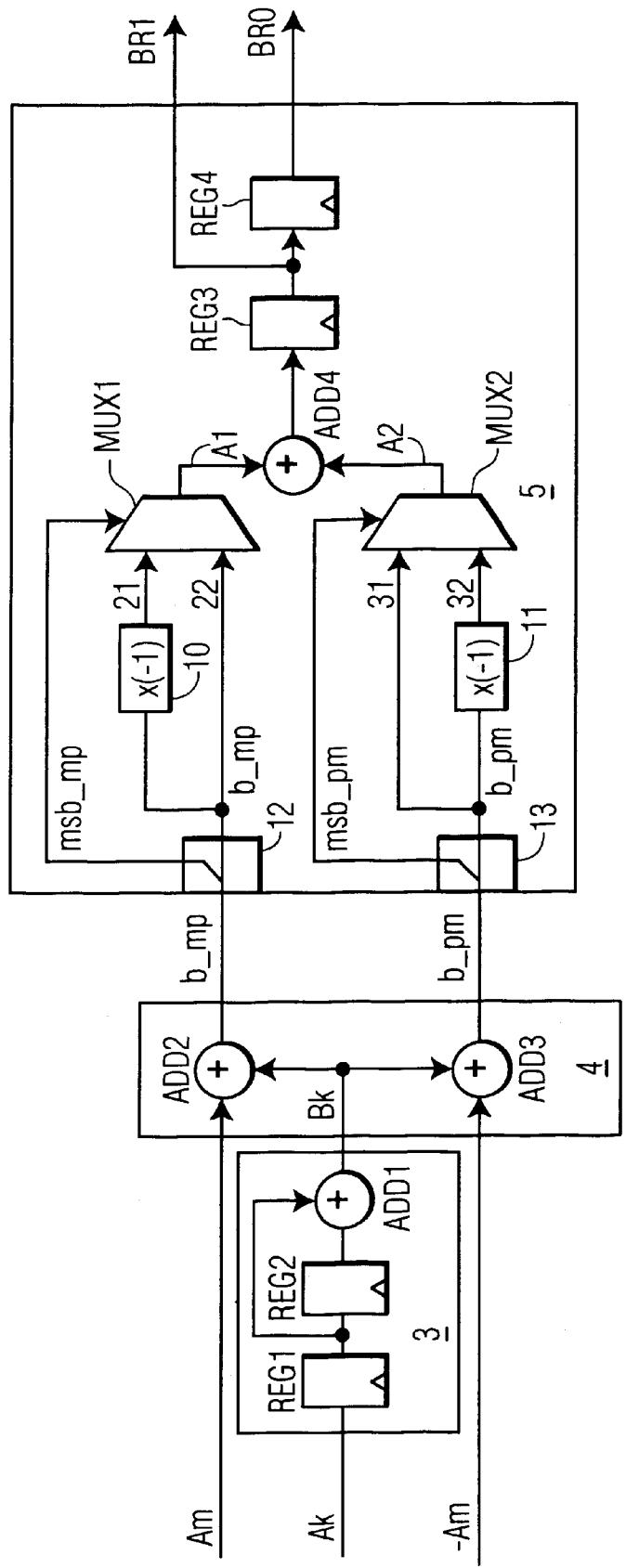
FIG. 3 shows an equalizer used in a maximum likelihood detector according to the invention.

FIG. 3 shows the (1+D) linear equalizer 3, the branch metrics calculation unit 4 and the merge determining unit 5 in more detail. The equalizer 3 handles the data according to expression:

$$B_k = A_k + A_{(k-1)}, \ k=1, 2, \ldots$$

It is therefore provided with two registers REG1, REG2 and an adder ADD1. The value $A_k$ is fed to the first register REG1, the output value $A_k$ of which is fed to adder ADD1 as well as to the second register REG2. The output of second register REG2, corresponding to the previous value $A_{(k-1)}$, is also fed to the adder ADD1, the output signal of which is the detector input value $B_k$.

The Branch metrics calculation unit 4 comprises two adders ADD2, ADD3 for calculating the branch metrics b__mp and b__pm according to b__mp=$B_k$+Am; b__pm=$B_k$−Am from detector input value $B_k$, average value Am and negated average value −Am.

The merge determining unit 6 judges the merges of the sampled data $Y_k$. The values of the branch metrics b__mp and b__pm are used to compute the merges m0, m+, m− of the sampling data, see FIG. 1d.

In FIG. 3 the merge determining unit is illustrated. This block consist of two circuits for the performance of the negation operation, indicated by X(−1) and named negators 10, 11, an adder ADD4, two multiplexers MUX1, MUX2 and two registers REG3 and REG4. Two circuits for the negation operation, negators 10, 11, two multiplexers MUX1, MUX2 and an adder ADD4 are used to determine which of branch metrics b__mp and b__pm is the one having minimum absolute value.

To perform this determination, the sign of each branch metric b__mp, b__pm is taken as control signal for multiplexers MUX1, MUX2. In the two's complement notation as used in this description, the sign is represented by the most significant bit msb__mp, msb__pm. The sign, represented by the most significant bit msb__mp, msb__pm, is taken from the branch metrics b__mp and b__pm at separators 12, 13. Branch metric b__mp is fed to input 22 of multiplexer MUX1, its negated value, after having passed negator 10, is fed to input 21 of multiplexer MUX1. Branch metric b__pm, is directly fed to input 31 of multiplexer MUX2, while its negated value is fed to input 32.

If the branch metric b__mp value is negative, i.e. if its most significant bit msb__mp equals 1, then the negated b__mp value goes through input 21 of multiplexer MUX1 to input A1 of adder ADD4. If the branch metric b__mp value is positive, i.e. if msb__mp equals 0, then b__mp value goes through the input 22 of multiplexer MUX1 to the input A1 of adder ADD4.

If the value of branch metric b__pm is negative, i.e. if msb__pm=1, then b__pm value goes through input 31 of multiplexer MUX2 to the input A2 of adder ADD4. If the value of branch metric bp__m is positive, i.e. if msb__pm=0, then the negated b__pm value goes through the input 32 of multiplexer MUX2 to the input A2 of adder ADD4.

The minimum absolute value is defined after the addition in adder ADD4 by the following: The sign of the sum, which is the output of adder 4, is evaluated. Here, it is the most significant bit msb__s of the sum.

If msb__s is equal to 1 then branch metric b__mp has the minimum absolute value.

If msb__s is equal to 0 then the branch metric b__pm has minimum absolute value.

The sign of the sum, here msb__s, is stored into a register REG3.

The output of register REG3 is output from merge determining unit 5 as merge determination signal BR1 as well as fed to a register REG4, the output of which is output as merge determination signal BR0.

The merge determination signals BR1 and BR0 determine the merges, which are output to the merge detecting unit 6. The merges are determined under the following conditions:

If BR1=1 and BR0=0, that means if minimum branch metric b__mp is preceded by minimum branch metric b__pm, see FIG. 1d, then a positive merge m+ has occurred.

If BR1=0 and BR0=1, that means if minimum branch metric b__pm is preceded by minimum branch metric b__mp, see FIG. 1d, then a negative merge m− has occurred.

If (BR1=0 and BR0=0) or if (Br1=1 and Br0=1), that means if two successive minimum branch metrics are identical either b__mp, b__mp or b__pm, b__pm, then a merge m0 without change of state has occurred.

Figure 4:
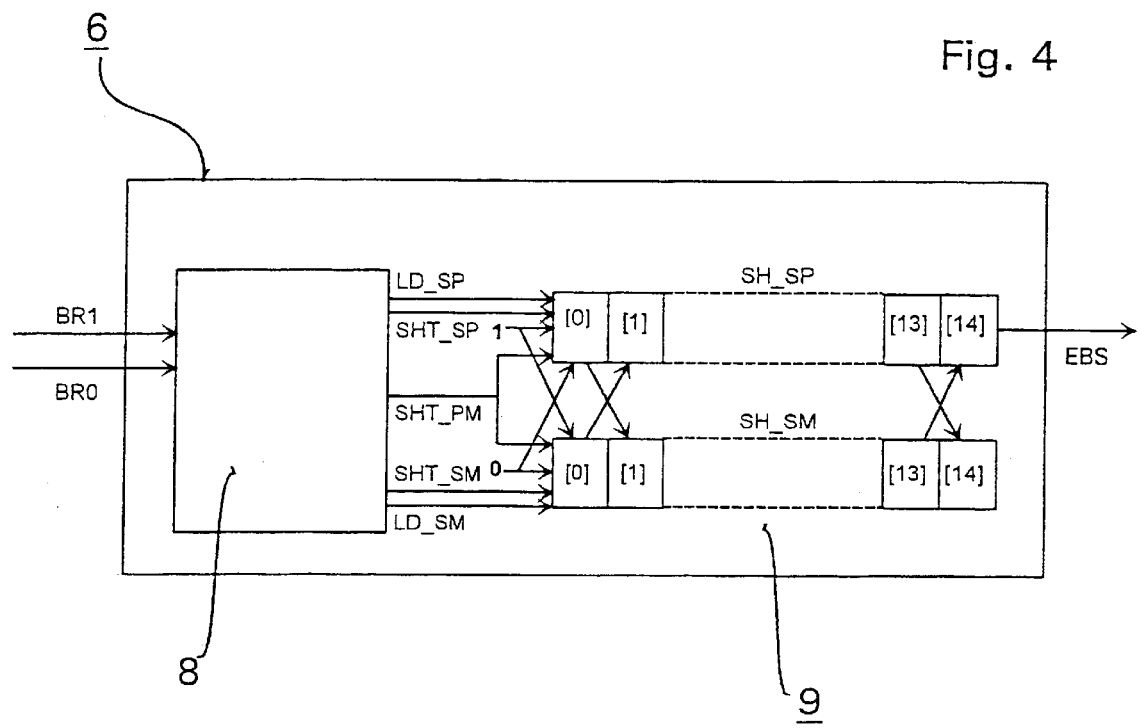
FIG. 4 shows a merge detection unit of a maximum likelihood detector according to the invention.
Figure 5:
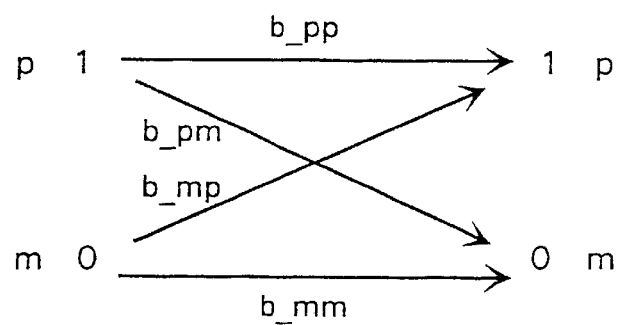
FIG. 5 shows an exemplary state transition diagram.

FIG. 4 illustrates the merge detecting unit 6. The merge detecting unit 6 consists of a control block 8 and cross-coupled shift registers SH__SP, SH__SM, which constitutes the path metrics memory 9. The control block 8 controls the path metrics memory 9.

Depending on the merges m0, m+, m−, indicated by merge determination signals BR0, BR1, the control block generates the following signals (FIG. 4):

LD__SP: load parallel the SH__SP register from the SH__SM register;

LD__SM: load parallel the SH__SM register from the SH__SP register;

SHT__SP: shift the contents of the SH__SP register to the right;

SHT__SM: shift the contents of the SH__SM register to the right;

SHT__PM: shift the contents of the SH__SM and SH__SP register to the right;

These registers are controlled as follows: If a merge m0 occurs, i.e. if merge determination signals BR0 and BR1 have equal value, then both registerd SH__SP and SH__SM are shifted at the same time and a "high" value is input to register SH__SP while a "low" value is input to register SH__SM. An according algorithm, using well known operators and conditions, is:

```
if(((BR1==0)&&(BR0==0)||( (BR1==1)&&(BR0==1)))
{
    for(j=0; j<14; ++j) {
        sh_sp[14-j]=sh_sp[13-j];
        sh_sm[14-j]=sh_sm[13-j];
    }
    sh_sp[0]=0; sh_sm=0;
}
```

In case of a merge m−, i.e. if a "low" level BR0=0 is followed by a "high" level BR1=1, the register SH_SP is loaded from register SH_SM, while register SH_SM is shifted and both registers have "low" level as input. An according algorithm is:

```
if((BR1==1)&&(BR0==0)) {
    for(j=0; j<14; ++j) sh_sp[j+1]=sh_sm[j];
    for(j=0; j<14; ++j) sh_sm[14-j]=sh_sm[13-j];
    sh_sp[0]=0; sh_sm[0]=0;
}
```

In case of a merge m+, i.e. transition from "high" to "low", register SH_SM is loaded from register SH_SP and register SH_SP is shifted. Both registers have, in this case, high level input. An according algorithm is:

```
if((BR1==0)&&(BR0==1)) {
    for(j=0; j<14; ++j) sh_sm[j+1]=sh_sp[j];
    for(j=0; j<14; ++j) sh_sp[14-j]=sh_sp[13-j];
    sh_sp[0]=1; sh_sm[0]=1;
}
```

The estimated bits sequence EBS is output from last element SH_SP [14] of register SH_SP.

The maximum likelihood detector according to the invention is not sensitive to variations of the input signal amplitude. It is independent of threshold conditions. It has a simple construction and simple working as only two branch metrics are computed in the matrix likelihood detector. A square operation, hitherto used for the calculation of the absolute values, is not performed by the computation of branch metrics according to the invention. According to the invention calculation of the absolute values is performed by using some properties like adders, multiplexers etc. of the arithmetic system of the hardware. The above mentioned positive properties lead to increase the ML detector speed and to decrease the hardware complexity without the loss of the ML detection power. The general idea of the invention can be applied also to audio or video CD and to DVD applications in an acquisition part to improve the detection of data read from a recording medium, especially an optical recording medium.

What is claimed, is:

1. A method to detect a bitstream signal received from a channel signal, comprising the steps of:
   digitizing the channel signal to form a digitized channel signal;
   equalizing the digitized channel signal to form an equalized signal;
   generating branch metrics from the equalized signal;
   determining a minimum metric as a minimum of the generated branch metrics;
   determining a type of merge from the minimum metric; and
   generating the bitstream signal from successive types of merges.

2. The method according to claim 1, wherein the step of generating the branch metrics is performed without using a square operation.

3. The method according to claim 2, wherein the branch metrics are generated for state changing transitions only.

4. The method according to claim 3, wherein the step of determining of the minimum branch metric comprises the steps of:
   adding absolute values of branch metrics to form an absolute metric sum; and
   taking a sign of said absolute metric sum as indication of the minimum metric.

5. The method according to claim 4, wherein the step of determining a type of merge is determined from two successive minimum metrics.

6. The method according to claim 3, further comprising the steps of:
   generating an absolute value of a first branch metric by inverting its least significant bits in case that its most significant bit is set to high level; and
   generating an absolute value of a second branch metric by inverting its least significant bits in case that its most significant bit is set to low level.

7. The method according to claim 1, wherein the branch metrics are generated for state changing transitions only.

8. The method according to claim 1, wherein the step of determining the minimum branch metric comprises the steps of:
   adding absolute values of branch metrics to form an absolute metric sum; and
   taking the sign of the absolute metric sum as indication of the minimum metric.

9. The method according to claim 8, wherein the type of merge is determined from two successive minimum metrics.

10. The method according to claim 1, further comprising the steps of:
    generating an absolute value of a first branch metric by inverting its least significant bits in case that its most significant bit is set to high level; and
    generating an absolute value of a second branch metric by inverting its least significant bits in case that its most significant bit is set to low level.

11. The method according to claim 1, wherein the type of merge is determined from two successive minimum metrics.

12. A device to detect a bitstream signal received from a channel signal, comprising:
    a converter to convert the channel signal into a digitized channel signal;
    a slicer to calculate an average value from the digitized channel signal;
    a subtractor to calculate a digitized signal from the digitized channel signal and the average value;
    an equalizer to generate an equalized signal from the digitized signal;
    a branch metrics calculator for generating branch metrics from the equalized signal;
    a merge determining unit for determining types of merges from the branch metrics; and
    a merge detection unit for generating the bitstream signal out of successive types of merges.

13. The device according to claim 12, wherein the branch metrics calculator comprises an adder for calculating the branch metric from the equalized signal and one of the average value and a negated average value.

14. The device according to claim 13, wherein the merge determining unit comprises an adder, two multiplexers, and two negators for determining a minimum absolute value of two input signals.

15. The device according to claim 12, wherein the merge determining unit comprises an adder, two multiplexers, and two negators for determining a minimum absolute value of two input signals.

* * * * *